(12) United States Patent
Redaelli et al.

(10) Patent No.: US 8,987,698 B2
(45) Date of Patent: Mar. 24, 2015

(54) MEMORY CONSTRUCTIONS

(71) Applicant: Micron Technology, Inc., Boise, ID (US)

(72) Inventors: Andrea Redaelli, Casatenovo (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/503,081

(22) Filed: Sep. 30, 2014

(65) Prior Publication Data

US 2015/0014623 A1 Jan. 15, 2015

Related U.S. Application Data

(60) Continuation of application No. 14/242,706, filed on Apr. 1, 2014, now Pat. No. 8,872,150, which is a division of application No. 13/658,676, filed on Oct. 23, 2012, now Pat. No. 8,729,519.

(51) Int. Cl.
*H01L 29/02* (2006.01)
*H01L 45/00* (2006.01)

(52) U.S. Cl.
CPC .............. *H01L 45/06* (2013.01); *H01L 45/144* (2013.01); *H01L 45/1233* (2013.01); *H01L 45/1253* (2013.01)
USPC ..... 257/2; 257/3; 257/4; 257/5; 257/E29.002; 438/102; 438/103; 438/104; 365/163

(58) Field of Classification Search
CPC ......... H01L 45/04; H01L 29/00; H01L 27/24; G11C 13/0004
USPC .................. 257/1–5, E29.002; 438/102–104; 365/163
See application file for complete search history.

(56) References Cited

U.S. PATENT DOCUMENTS

| | | | |
|---|---|---|---|
| 4,855,950 A | | 8/1989 | Takada |
| 5,920,788 A | * | 7/1999 | Reinberg ...................... 438/466 |
| 6,265,734 B1 | | 7/2001 | Fischer et al. |
| 7,323,734 B2 | | 1/2008 | Ha et al. |
| 8,022,382 B2 | | 9/2011 | Lai et al. |
| 8,223,538 B2 | | 7/2012 | Dennison et al. |
| 2003/0155589 A1 | * | 8/2003 | Campbell et al. ............ 257/225 |
| 2010/0321992 A1 | | 12/2010 | Liu et al. |
| 2011/0049454 A1 | | 3/2011 | Terao et al. |
| 2011/0207284 A1 | | 8/2011 | Tominaga et al. |
| 2011/0315942 A1 | | 12/2011 | Tominaga et al. |

OTHER PUBLICATIONS

Simpson et al., "Interfacial phase-change memory", Nature Nanotechnology, vol. 6, Aug. 2011, pp. 501-505.

* cited by examiner

*Primary Examiner* — Jami M Valentine
(74) *Attorney, Agent, or Firm* — Wells St. John P.S.

(57) ABSTRACT

Some embodiments include memory constructions having a plurality of bands between top and bottom electrically conductive materials. The bands include chalcogenide bands alternating with non-chalcogenide bands. In some embodiments, there may be least two of the chalcogenide bands and at least one of the non-chalcogenide bands. In some embodiments, the memory cells may be between a pair of electrodes; with one of the electrodes being configured as a lance, angled plate, container or beam. In some embodiments, the memory cells may be electrically coupled with select devices, such as, for example, diodes, field effect transistors or bipolar junction transistors.

15 Claims, 3 Drawing Sheets

MEMORY CONSTRUCTIONS

RELATED PATENT DATA

This patent resulted from a continuation of U.S. patent application Ser. No. 14/242,706, which was filed Apr. 1, 2014, and which is hereby incorporated herein by reference; which resulted from a divisional of U.S. patent application Ser. No. 13/658,676, which was filed Oct. 23, 2012, which issued as U.S. Pat. No. 8,729,519, and which is hereby incorporated herein by reference.

TECHNICAL FIELD

Memory constructions.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are phase change memory (PCM) cells.

PCM cells may comprise selectable memory states corresponding to a high resistance state (HRS) and a low resistance state (LRS). Traditional PCM cells have a phase change material (for instance, a chalcogenide; such as a so-called GST material comprising a mixture of germanium, antimony and tellurium) as the programmable material. In operation, a portion of the phase change material is altered in phase in the HRS state relative to the LRS state. For instance, the portion may be amorphous in one of the states, and crystalline in the other. Accordingly, the PCM cells may be transitioned between the HRS and LRS states by melting a region of phase change material, and then either crystallizing the material or amorphizing the material.

Problems may be encountered during the transitioning between the FIRS and LRS states. For instance, the melting of the phase change material may induce segregation within such material, which can eventually degrade operation of the memory cells. Also, the temperature utilized for melting of the phase change material may lead to degradation of memory cells and/or associated circuitry over time. Further, the power consumption associated with achieving the melting temperature of the phase change material may problematically reduce battery life of portable electronic devices.

Efforts have been made to develop materials analogous to those utilized in PCM cells, but which transition between the HRS and LRS states through other mechanisms besides melting of the programmable material. For instance, solid-state memory has been developed which comprises so-called chalcogenide superlattices. The chalcogenide superlattices are comprised by multiple stacked layers of different chalcogenides (see, for example, US patent publication numbers 2011/0207284 and 2011/0315942). Such memory may transit from one memory state to another through changes in lattice structures and/or bonding, and thus may transition at lower temperatures than the melting temperatures associated with traditional PCM.

Problems may be encountered in attempting to form and utilize memory cells comprising stacked chalcogenides.

It is desired to develop improved memory cells which may have benefits analogous to those of stacked chalcogenides, but which may reduce, overcome, or entirely avoid the difficulties encountered with chalcogenide superlattices.

DETAILED DESCRIPTION OF THE ILLUSTRATED EMBODIMENTS

Some embodiments include memory constructions containing alternating bands of chalcogenide material and non-chalcogenide material. Such alternating bands may be utilized in programmable regions of the memory cells, and may provide advantages analogous to those obtained with chalcogenide superlattices. Additionally, a wider variety of materials may be utilized in the alternating bands of programmable materials described herein as compared to the materials suitable for utilization in chalcogenide superlattices, which can enable the programmable materials described herein to be more readily tailored for specific applications. Also, it may be cheaper and/or simpler to fabricate the multi-banded regions described herein as compared to chalcogenide superlattices. Further, the multi-banded programmable materials described herein may enable fabrication of memory constructions having improved endurance relative to prior art memory constructions, and/or reduced power consumption relative to prior art memory constructions. In some embodiments, multi-banded regions may provide similar advantages as chalcogenide superlattices in terms of low-power and sub-melting operation (thus, similar advantages on cycling capability) but without issues related to material intermixing that may occur in superlattices due to two chalcogenide layers being directly against one other. In some embodiments, conductive bands are placed between chalcogenide layers, and such conductive bands may alleviate or prevent the problematic interdiffusion between chalcogenide materials that may be associated with superlattices. In such embodiments, it may be preferable to use diffusion barriers as the conductive bands. Example embodiments are described with reference to FIGS. 1-5.

Figure 1:
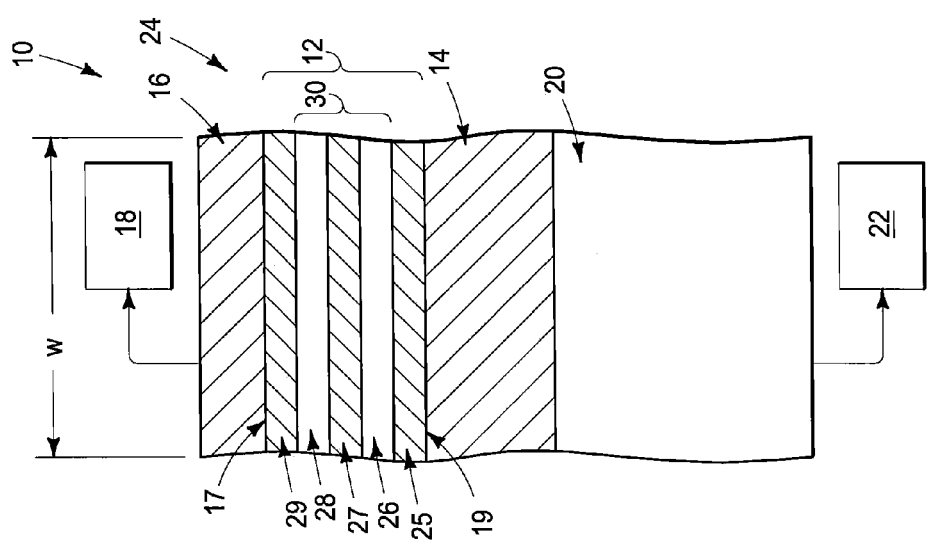
FIG. 1 is a diagrammatic, cross-sectional view of an example embodiment memory construction.

Referring to FIG. 1, a memory construction 10 comprises a stack 12 between a pair of electrically conductive electrodes 14 and 16.

In the shown embodiment, the electrodes 14 and 16 may be referred to as a bottom electrode and a top electrode, respectively. The electrodes 14 and 16 may comprise any suitable composition or combination of compositions; and in some embodiments may comprise, consist essentially of, or consist of one or more of various metals (for instance, titanium, tungsten, etc.), metal-containing compounds (for instance, metal silicides, metal nitrides, metal carbides, etc.), and conductively-doped semiconductor materials (for instance, conductively-doped silicon, conductively-doped germanium, etc.).

In some embodiments, the top electrode 16 may be electrically coupled with a line (for instance, a sense/access line, such as a bitline), with such line being diagrammatically illustrated by the box 18 in the shown embodiment. The electrode may be part of the line, or may be a structure having a different composition and/or pattern relative to such line.

The bottom electrode 14 is shown to be electrically coupled to a select device 20, which in turn may be electrically coupled with a line (for instance, a sense/access line, such as a wordline), with such line being diagrammatically illustrated by the box 22 in the shown embodiment.

The select device 20 may comprise any suitable component, such as, for example, a field effect transistor (FET), a diode, or a bipolar junction transistor (BJT). For instance, the select device may correspond to a pedestal of semiconductor material which is appropriately doped with alternating p-type and n-type regions to be configured as a PN diode, an NP diode, a PNP bipolar junction transistor, an NPN bipolar junction transistor, a p-channel FET, or an n-channel FET.

The select device 20 may be omitted in some embodiments, or in some embodiments may be provided in a different location than the shown location between the electrode 14 and the access/sense line 22 (e.g., between 16 and 20).

The electrodes 14 and 16, together with the stack 12, form a memory cell 24. Such memory cell may be exemplary of a large number of memory cells fabricated in a memory array across a semiconductor construction. The line 18 may be comprised by a first series of access/sense lines, and the line 22 may be comprised by a second series of access/sense lines. The individual memory cells of the array may be uniquely addressed through combinations of access/sense lines from the first series with access/sense lines from the second series.

The stack 12 comprises alternating non-chalcogenide bands 25, 27 and 29; and chalcogenide bands 26 and 28. The non-chalcogenide bands may comprise the same composition as one another in some embodiments, and in other embodiments at least two of the illustrated non-chalcogenide bands may comprise a different composition than another of the non-chalcogenide bands. Similarly, the chalcogenide bands may comprise the same composition as one another in some embodiments, and in other embodiments may comprise different compositions from one another.

The non-chalcogenide bands 25 and 29 are electrically conductive materials that electrically couple stack 12 with electrodes 14 and 16. In some embodiments, the material of band 29 may be referred to as a first electrically conductive material between the top electrode 16 and the upper chalcogenide band 28, and the material of band 25 may be referred to as a second electrically conductive material between the lower chalcogenide band 26 and the bottom electrode 14.

The bands 25 and 29 may comprise any suitable compositions or combinations of compositions; and in some embodiments may comprise, consist essentially of, or consist of carbon (for instance, amorphous carbon or any other suitable form of carbon), one or more of various metals (for instance, titanium, tantalum, tungsten, etc.), metal-containing compounds (for instance, metal silicides, metal nitrides, metal carbides, etc.), and conductively-doped semiconductor materials (for instance, conductively-doped silicon, conductively-doped germanium, etc.). In some embodiments, bands 25 and 29 may be omitted, so that electrodes 16 and 14 directly contact the chalcogenide bands 26 and 28 of stack 12.

In some embodiments, it may be desirable to avoid utilization of conductively-doped semiconductor materials in bands 25 and 29 because the relatively high temperatures utilized for deposition of the semiconductor materials and/or activation of dopant may degrade chalcogenide and/or other materials of memory cell 24. However, if appropriate conditions and materials are utilized, it may be possible to incorporate conductively-doped semiconductor materials into bands 25 and 29.

In some embodiments, it may be particularly advantageous for the conductive bands 25 and 29 to comprise carbon, in that the interface of the carbon with the chalcogenide materials 26 and 28 can have desirable properties of good physical bonding between the chalcogenide materials and the carbon, and programmability through, for example, lattice alteration and/or changes in bonding between the chalcogenide materials and the carbon. The possible mechanisms of programmability are provided to assist the reader in understanding some embodiments described herein, and are not to limit any of such embodiments except to the extent, if any, that such mechanisms are expressly recited in the claims which follow.

The non-chalcogenide band 27 may comprise any suitable material; and in some embodiments may comprise an electrically conductive material, such as, for example, one or more of carbon, metal, metal-containing compounds, and conductively-doped semiconductor materials. In some embodiments, it may be desirable to avoid utilization of conductively-doped semiconductor materials for band 27 for reasons analogous to those discussed above regarding bands 25 and 29. Also, in some embodiments it may be advantageous to utilize carbon for band 27 for reasons analogous to those discussed above regarding bands 25 and 29.

In some embodiments, the band 27 may comprise dielectric material, and may be thin enough so that tunneling may occur between chalcogenide bands 26 and 28. For instance, band 27 may comprise dielectric material (for instance, silicon dioxide, silicon nitride, hafnium oxide, etc.) having a thickness of less than or equal to about 1 nanometer (nm).

The chalcogenide materials 26 and 28 may comprise any suitable compositions; and in some embodiments may comprise one or more materials selected from the group consisting of germanium, indium, tellurium and antimony. For instance, one or both of the chalcogenide bands 26 and 28 may comprise, consist essentially of, or consist of a mixture of germanium, antimony and tellurium (for instance, $Ge_2Sb_2Te_5$, or any other suitable stoichiometry); which may be referred to as GST. As another example, one or both of the bands 26 and 28 may comprise, consist essentially of, or consist of a mixture of antimony and tellurium (for instance, $Sb_2Te_3$, or any other suitable stoichiometry); which may be referred to as SbTe. As yet another example, one or both of the bands 26 and 28 may comprise, consist essentially of, or consist of a mixture of germanium and tellurium; which may be referred to as GeTe. In some embodiments, one of the layers 26 and 28 consists of GeTe and the other consists of SbTe.

The bands 25-29 may comprise any suitable thicknesses, and in some embodiments are all less than or equal to about 5 nm thick. For instance, in some embodiments the bands 25-29 may have thicknesses of from about 1 nm to about 5 nm. The bands may be formed by any suitable methodology, including, for example, one or more of atomic layer deposition (ALD), chemical vapor deposition (CVD), metal organic chemical vapor deposition (MOCVD), and physical vapor deposition (PVD).

In operation, the bands 25-29 form a programmable region of memory cell 24. Such programmable region has two or more interchangeable memory states. The physical difference between the memory states may correspond to something other than the crystallinity within chalcogenide bands 26 and 28; and may, for example, comprise differences in lattice configuration along interfaces of the chalcogenide bands and the non-chalcogenide bands and/or may comprise differences in bonding arrangements between the chalcogenide bands and the non-chalcogenide bands. In some embodiments, the transition from one memory state to another for the memory cell 24 may be accomplished at a lower temperature, and with less power input, than can a transition in a conventional PCM cell due to the transition of memory cell 24 not requiring changes in phase of the chalcogenide materials. Further, in some embodiments the memory cell 24 may have improved endurance relative to conventional PCM cells; which may be in part due to the memory cell 24 being operated under lower-temperature conditions than conventional PCM cells.

In some embodiments, the stack 12 may be considered to comprise a width "w" along the cross-section of FIG. 1. The top electrode 16 joins the electrically conductive material of band 29 at an interface 17, and the bottom electrode 14 joins the electrically conductive material of band 25 at an interface 19. The interfaces 17 and 19 may be referred to as first and second interfaces, respectively. The top electrode has a dimension along the first interface which is at least as long as the width "w" of stack 12, and the bottom electrode has a dimension along the second interface which is also at least as long as the width "w" of the stack. In some embodiments, the bottom electrode 14 may be considered to be configured as a horizontally-extending beam in the construction of FIG. 1.

The construction 10 may be supported by a semiconductor substrate (not shown). Such substrate may comprise, consist essentially of, or consist of monocrystalline silicon, or any other suitable semiconductor material. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the semiconductor substrate may contain one or more materials associated with integrated circuit fabrication. In such embodiments, such materials may correspond to one or more of refractory metal materials, barrier materials, diffusion materials, insulator materials, etc.

In some embodiments, the memory cell 24 may be considered to comprise a region 30 having a pair of chalcogenide bands 26 and 28 spaced apart from one another by the intervening non-chalcogenide band 27, with each of the chalcogenide bands directly contacting the intervening non-chalcogenide band. Although the illustrated memory cell only comprises one of such regions, in other embodiments memory cells may comprise more than one region analogous to the illustrated region 30. Such may provide an additional parameter relative to the fabrication of the memory cells, (besides the choices of materials in the chalcogenide bands and non-chalcogenide bands, the choices of thicknesses of the chalcogenide bands and non-chalcogenide bands, etc.) which can further enable operational characteristics of memory cells to be tailored for specific applications.

Figure 2:
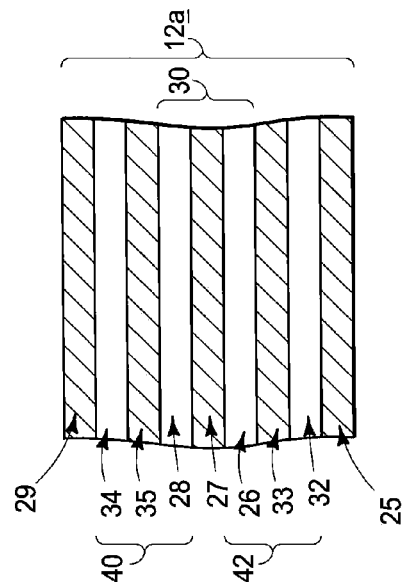
FIG. 2 is a diagrammatic, cross-sectional view of an example embodiment stack that may be utilized in example embodiment memory constructions alternatively to a stack shown in the FIG. 1 memory construction.

A stack 12a is shown in FIG. 2 as an example of a stack analogous to the stack 12 of FIG. 1, but having additional chalcogenide bands and non-chalcogenide bands relative to the stack 12 of FIG. 1. The stack 12a comprises the outer conductive non-chalcogenide bands 25 and 29 discussed above with reference to FIG. 1, and comprises the region 30 containing the non-chalcogenide band 27 between chalcogenide bands 26 and 28. Additionally, the stack 12a comprises chalcogenide bands 32 and 34, and non-chalcogenide bands 33 and 35. The chalcogenide bands 28 and 34, together with the non-chalcogenide band 35, form a region 40 containing a non-chalcogenide band between a pair of chalcogenide bands (analogous to the region 30); and similarly the chalcogenide bands 32 and 26, together with the non-chalcogenide band 33, form a region 42 containing a non-chalcogenide band between a pair of chalcogenide bands (analogous to the region 30). All of the chalcogenide bands of stack 12a may comprise the same composition as one another in some embodiments; and in other embodiments at least two of the chalcogenide bands may comprise different compositions relative to one another. Similarly, all of the non-chalcogenide bands of stack 12a may comprise the same composition as one another in some embodiments; and in other embodiments at least two of the non-chalcogenide bands may comprise different compositions relative to one another.

An advantage of programmable regions described herein can be that they may be readily incorporated into existing memory architectures. Such architectures may utilize any of numerous arrangements of electrodes analogous to the electrodes 14 and 16 of FIG. 1. A few other example electrode arrangements that may be utilized are described with reference to FIGS. 3-5.

Figure 3:
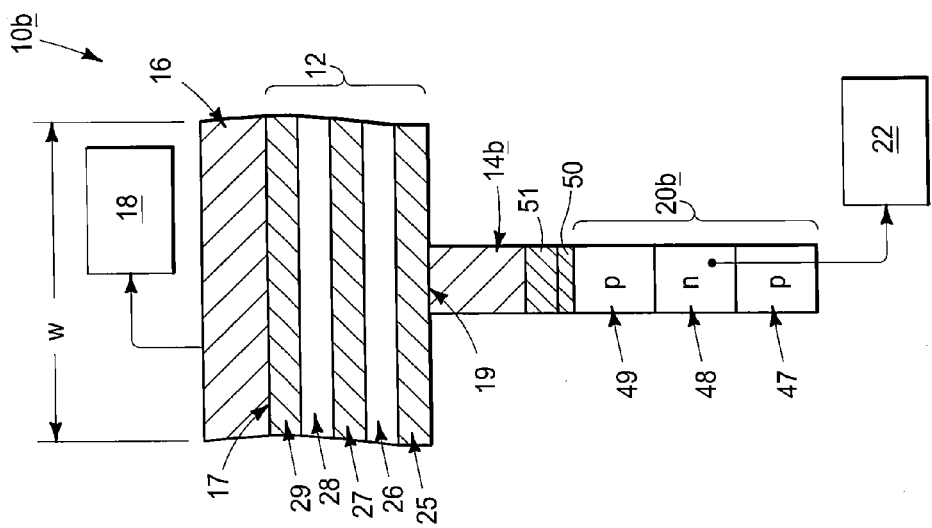
FIG. 3 is a diagrammatic, cross-sectional view of another example embodiment memory construction.

Referring to FIG. 3, a construction 10b comprises a stack 12 between a bottom electrode 14b and a top electrode 16. The electrode 16 is identical to that described above with reference to FIG. 1, and the electrode 14b is narrower than the analogous electrode discussed above with reference to FIG. 1.

The top electrode 16 is electrically coupled with the line diagrammatically illustrated by the box 18; and the bottom electrode 14b is shown to be electrically coupled to a select device 20b, which in turn is electrically coupled with the line diagrammatically illustrated by the box 22. The illustrated select device 20b is a PNP BJT; and specifically comprises an n-type doped region 48 between a pair of p-type doped regions 47 and 49. The BJT 20b may comprise a pillar of conductively-doped semiconductor material (such as, for example, conductively-doped silicon). The electrode 14b may be electrically coupled to the top p-doped region 49 through a metal plug 51 (for instance, a plug comprising tungsten, titanium, etc.) and a metal silicide 50 (for instance, tungsten silicide, titanium silicide, nickel silicide, etc.). The line 22 is electrically connected to the n-type collector region 48 of the PNP BJT, while p-doped collector 47 is usually grounded.

Although the BJT 20b is shown as the select device in the embodiment of FIG. 3, other types of select devices may be utilized in place of the illustrated BJT 20b in other embodiments.

The stack 12 comprises the alternating chalcogenide bands and non-chalcogenide bands; with the chalcogenide bands being shown as bands 26 and 28, and the non-chalcogenide bands being shown as bands 25, 27 and 29. In other embodiments, other arrangements of alternating chalcogenide and non-chalcogenide bands may be utilized in place of the shown stack 12. For instance, in some embodiments the stack may have more than two chalcogenide bands; and may be, for example, identical to, or analogous to, the stack 12a described above with reference to FIG. 2.

The stack 12 comprises the width "w" along the cross-section of FIG. 3. The top electrode 16 joins the electrically conductive material of band 29 at the first interface 17, and the bottom electrode 14b joins the electrically conductive material of band 25 at the second interface 19. The top electrode has a dimension along the first interface which is at least as long as the width "w" of stack 12, and the bottom electrode has a dimension along the second interface which is not as long as the width "w" of the stack. In some embodiments, the bottom electrode 14b may be considered to be an example of a lance configuration in the construction of FIG. 3.

Figure 4:
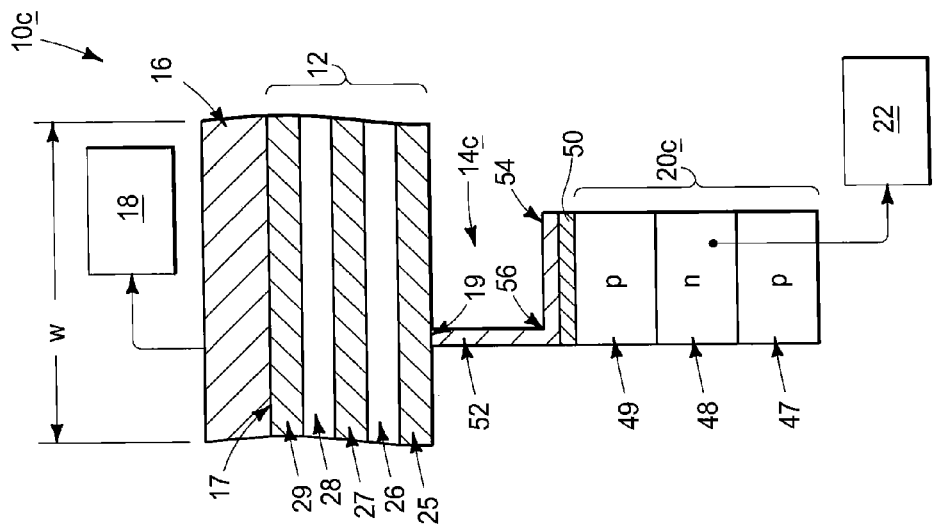
FIG. 4 is a diagrammatic, cross-sectional view of another example embodiment memory construction.

Referring to FIG. 4, another example electrode arrangement is described with reference to a construction 10c. The construction comprises a stack 12 between a bottom electrode 14c and a top electrode 16. The electrode 16 is identical to that described above with reference to FIG. 1, and the electrode 14c is different from the analogous electrode discussed above with reference to FIG. 1.

The top electrode 16 is electrically coupled with the line diagrammatically illustrated by the box 18; and the bottom electrode 14c is shown to be electrically coupled to a select device 20c, which in turn is electrically coupled with the line diagrammatically illustrated by the box 22. The illustrated select device 20c is a PNP BJT; and specifically comprises the n-type doped region 48 between the pair of p-type doped regions 47 and 49. The electrode 14c may be electrically coupled to the top p-doped region 49 through the metal silicide 50, as shown in FIG. 4; and/or through a metal plug (not shown) analogous to the plug 51 of FIG. 3.

Although the BJT 20c is shown as the select device in the embodiment of FIG. 4, other types of select devices may be utilized in place of the illustrated BJT 20c in other embodiments.

The stack 12 comprises the alternating chalcogenide bands and non-chalcogenide bands; with the chalcogenide bands being shown as bands 26 and 28, and the non-chalcogenide bands being shown as bands 25, 27 and 29. In other embodiments, other arrangements of alternating chalcogenide and non-chalcogenide bands may be utilized in place of the shown stack 12. For instance, in some embodiments the stack may have more than two chalcogenide bands; and may be, for example, identical to, or analogous to, the stack 12a described above with reference to FIG. 2.

The stack 12 comprises the width "w" along the cross-section of FIG. 4. The top electrode 16 joins the electrically conductive material of band 29 at the first interface 17, and the bottom electrode 14c joins the electrically conductive material of band 25 at the second interface 19. The top electrode has a dimension along the first interface which is at least as long as the width "w" of stack 12, and the bottom electrode has a dimension along the second interface which is not as long as the width "w" of the stack. In some embodiments, the bottom electrode 14c may be considered to be an example of an angled plate configuration in the construction of FIG. 4. The angled plate is "L-shaped" in the shown embodiment, and specifically has a vertical portion 52 joined to a horizontal portion 54 at a corner 56 of about 90°. In other embodiments, the angled plate may have other shapes. For example, the corner may have an angle other than about 90°.

Figure 5:
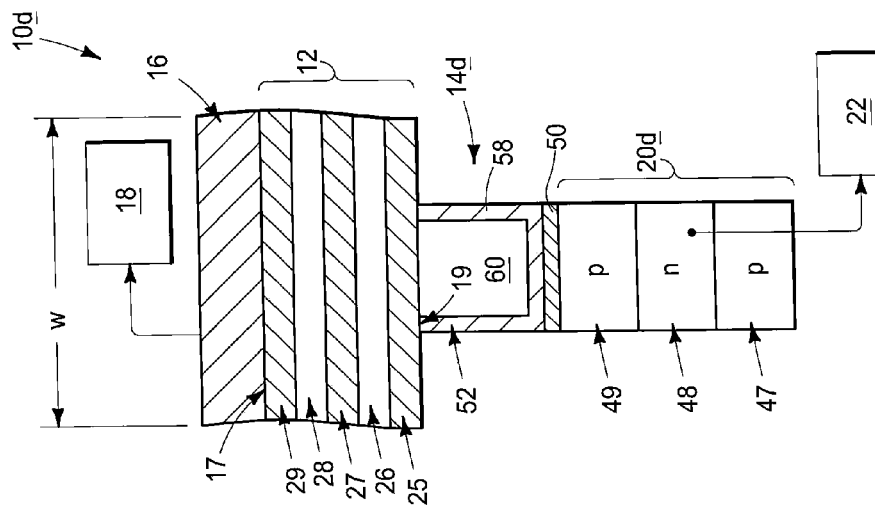
FIG. 5 is a diagrammatic, cross-sectional view of another example embodiment memory construction.

Referring to FIG. 5, another example electrode arrangement is described with reference to a construction 10d. The construction comprises a stack 12 between a bottom electrode 14d and a top electrode 16. The electrode 16 is identical to that described above with reference to FIG. 1, and the electrode 14d is different from the analogous electrode discussed above with reference to FIG. 1.

The top electrode 16 is electrically coupled with the line diagrammatically illustrated by the box 18; and the bottom electrode 14d is shown to be electrically coupled to a select device 20d, which in turn is electrically coupled with the line diagrammatically illustrated by the box 22. The illustrated select device 20d is a PNP BJT; and specifically comprises the n-type doped region 48 between the pair of p-type doped regions 47 and 49. The electrode 14d may be electrically coupled to the top p-doped region 49 through the metal silicide 50, as shown in FIG. 5; and/or through a metal plug (not shown) analogous to the plug 51 of FIG. 3.

Although the BJT 20d is shown as the select device in the embodiment of FIG. 5, other types of select devices may be utilized in place of the illustrated BJT 20d in other embodiments.

The stack 12 comprises the alternating chalcogenide bands and non-chalcogenide bands; with the chalcogenide bands being shown as bands 26 and 28, and the non-chalcogenide bands being shown as bands 25, 27 and 29. In other embodiments, other arrangements of alternating chalcogenide and non-chalcogenide bands may be utilized in place of the shown stack 12. For instance, in some embodiments the stack may have more than two chalcogenide bands; and may be, for example, identical to, or analogous to, the stack 12a described above with reference to FIG. 2.

The stack 12 comprises the width "w" along the cross-section of FIG. 5. The top electrode 16 joins the electrically conductive material of band 29 at the first interface 17, and the bottom electrode 14d joins the electrically conductive material of band 25 at the second interface 19. The top electrode has a dimension along the first interface which is at least as long as the width "w" of stack 12, and the bottom electrode has a dimension along the second interface which is not as long as the width "w" of the stack. In some embodiments, the bottom electrode 14d may be considered to be an example of a container configuration in the construction of FIG. 5. Specifically, the electrode 14d comprises a conductive material 58 configured as an upwardly-opening container. Such container may form a ring when viewed from above; and accordingly the interface 19 may correspond to a ring when considered in three-dimensions.

In the shown embodiment, a dielectric material 60 is within the container formed by material 58. The dielectric material 60 may comprise any suitable composition or combination of compositions; including, for example, one or more of silicon dioxide, silicon nitride, doped silicate glass (for instance, borophosphosilicate glass), etc.

The conductive material 58 may comprise any of the compositions described above as being suitable for utilization in the electrode 14 of FIG. 1.

The memory constructions of FIGS. 3-5 may be utilized in memory arrays analogous to the memory array described above with reference to the memory construction of FIG. 1.

The memory structures and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory construction comprising at least one region having a pair of chalcogenide bands spaced apart from one another by a non-chalcogenide band. The chalcogenide bands and the non-chalcogenide band may have thicknesses of less than about 5 nanometers.

Some embodiments include a memory construction comprising a stack which includes a bottom electrically conductive material, a top electrically conductive material, and a plurality of bands between the top and bottom electrically conductive materials. The bands include chalcogenide bands alternating with non-chalcogenide bands. There may be at least two of the chalcogenide bands and at least one of the non-chalcogenide bands.

Some embodiments include a memory construction comprising a bottom electrode, a stack over the bottom electrode, a top electrode over the stack. The stack has chalcogenide bands alternating with non-chalcogenide bands. There may be at least two of the chalcogenide bands and at least one of the non-chalcogenide bands. The stack includes a first electrically conductive material between the top electrode and an uppermost of the chalcogenide bands, and the stack includes a second electrically conductive material between a lowermost of the chalcogenide bands and the bottom electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory construction comprising a stack which includes a bottom electrically conductive material electrically coupled with a select device, a top electrically conductive material, and a plurality of bands between the top and bottom electrically conductive materials; the bands including chalcogenide bands alternating with non-chalcogenide bands; wherein there at least two of the chalcogenide bands and at least one of the non-chalcogenide bands; and wherein one or more of the non-chalcogenide bands comprise carbon.

2. The memory construction of claim 1 wherein two or more of the non-chalcogenide bands differ in composition relative to one another.

3. The memory construction of claim 1 wherein the select device comprises a diode.

4. The memory construction of claim 1 wherein the select device comprises a bipolar junction transistor.

5. The memory construction of claim 1 wherein the select device comprises a field effect transistor.

6. The memory construction of claim 1 wherein at least two of the chalcogenide bands are of different compositions relative to one another; wherein at least one of the chalcogenide bands consists of germanium and tellurium; and wherein another of the chalcogenide bands consists of antimony and tellurium.

7. The memory construction of claim 1 wherein the chalcogenide bands and the non-chalcogenide band have thicknesses less than about 5 nanometers.

8. A memory construction comprising:
a bottom electrode electrically coupled with a select device which is electrically coupled with a sense/access line comprised by a first series of sense/access lines;
a stack over the bottom electrode; said stack comprising chalcogenide bands alternating with non-chalcogenide bands; wherein there at least two of the chalcogenide bands and at least one of the non-chalcogenide bands;
a top electrode over the stack and electrically coupled with a sense/access line which is comprised by a second series of sense/access lines;
the stack including a first electrically conductive material between the top electrode and an uppermost of the chalcogenide bands;
the stack including a second electrically conductive material between a lowermost of the chalcogenide bands and the bottom electrode; and
wherein both of the first and second electrically conductive materials comprise carbon; and wherein the at least one non-chalcogenide band comprises carbon.

9. The memory construction of claim 8 wherein the chalcogenide and non-chalcogenide bands have thicknesses of less than or equal to about 5 nanometers.

10. The memory construction of claim 8 wherein:
the stack has a width along a cross-section;
there is a first interface between the top electrode and the first electrically conductive material;
there is a second interface between the bottom electrode and the second electrically conductive material;
the top electrode has a dimension along the first interface at least as long as the width of the stack; and
the bottom electrode is configured as a beam having a dimension along the second interface at least as long as the width of the stack.

11. The memory construction of claim 8 wherein:
the stack has a width along a cross-section;
there is a first interface between the top electrode and the first electrically conductive material;
there is a second interface between the bottom electrode and the second electrically conductive material;
the top electrode has a dimension along the first interface at least as long as the width of the stack; and
the bottom electrode has a dimension along the second interface that is less than the width of the stack.

12. The memory construction of claim 11 wherein the bottom electrode is a lance configuration.

13. The memory construction of claim 11 wherein the bottom electrode is an angled plate configuration.

14. The memory construction of claim 11 wherein the bottom electrode is a container configuration.

15. The memory construction of claim 8 wherein the select device is a diode, a field effect transistor or a bipolar junction transistor.

* * * * *